(12) United States Patent
Peters et al.

(10) Patent No.: US 7,567,603 B2
(45) Date of Patent: Jul. 28, 2009

(54) SEMICONDUCTOR LASER DIODE WITH ADVANCED WINDOW STRUCTURE

(75) Inventors: Matthew Glenn Peters, Menlo Park, CA (US); Victor Rossin, Mountain View, CA (US); Erik Paul Zucker, Los Altos, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 11/856,501

(22) Filed: Sep. 17, 2007

(65) Prior Publication Data

US 2008/0069165 A1    Mar. 20, 2008

Related U.S. Application Data

(60) Provisional application No. 60/826,238, filed on Sep. 20, 2006.

(51) Int. Cl.
*H01S 5/00*    (2006.01)

(52) U.S. Cl. ............... 372/45.01; 372/46.01; 372/87

(58) Field of Classification Search ............ 372/45.01, 372/46.01, 87
See application file for complete search history.

(56) References Cited

U.S. PATENT DOCUMENTS

| 4,759,025 A | 7/1988 | Kamejima | 372/46.01 |
| 4,845,725 A | 7/1989 | Welch et al. | 372/46.016 |
| 6,148,014 A * | 11/2000 | Geels et al. | 372/46.01 |
| 6,373,875 B1 | 4/2002 | Yu et al. | 372/46.01 |
| 2004/0120378 A1* | 6/2004 | Tanaka | 372/45 |

* cited by examiner

*Primary Examiner*—Minsun Harvey
*Assistant Examiner*—Yuanda Zhang
(74) *Attorney, Agent, or Firm*—Allen, Dyer, Doppelt, Milbrath & Gilchrist, P.A. Attorneys at Law

(57) ABSTRACT

The invention relates to a semiconductor laser diode structure with increased catastrophic optical damage (COD) power limit, featuring three sections, sometimes called windows, at the output facet of the diode. These include an optically transparent section, a current blocking section and a partially current blocking section.

16 Claims, 12 Drawing Sheets

| Design | Ith Avg | Eff Avg | Wav Avg | Iop Avg | Burn-In 12A | | | Post BI 20A | | |
|---|---|---|---|---|---|---|---|---|---|---|
| | | | | | In | Out | Yield | In | Out | Yield |
| Baseline Window | 409 | 0.985 | 943 | 7450 | 19 | 11 | 58% | 9 | 7 | 78% |
| Patterned Pumping | 414 | 0.990 | 942 | 7379 | 20 | 19 | 95% | 9 | 9 | 100% |

Fig. 9

SEMICONDUCTOR LASER DIODE WITH ADVANCED WINDOW STRUCTURE

CROSS-REFERENCE TO RELATED APPLICATIONS

The present invention claims priority from U.S. Patent Application No. 60/826,238 filed Sep. 20, 2006, entitled "SEMICONDUCTOR LASER DIODE WITH ADVANCED WINDOW STRUCTURE", which is incorporated herein by reference.

TECHNICAL FIELD

The present invention relates to semiconductor lasers, in particular high power lasers where catastrophic optical damage to the facets is one of the main factors limiting the maximum optical output power.

BACKGROUND OF THE INVENTION

One limiting factor for the maximum power of a semiconductor laser diode design is the catastrophic optical damage (COD) limit at the output front facet of the laser diode. Essentially the very high optical power density, current density and carrier density interact with defects, non-radiative recombination centers, optical absorption areas and the semiconductor/coating/air interface to cause excess heating and eventually destructive failure. Various methods have been employed to increase the COD limit which will be discussed along with the new inventions.

Note that the COD generally occurs at the output front facet due to the higher optical power density relative to the rear facet. This invention applies primarily to the front facet window, however the same considerations as disclosed in this invention can also be applied to the rear facet. The front facet typically has a low reflectivity coating or coating stack deposited after an optional surface passivation. The rear facet is typically coated with a high reflectivity coating or coating stack. Also note that this window design applies to any high power semiconductor laser at any lasing wavelength including, but not limited to, single-mode lasers, multi-mode lasers, fiber-coupled lasers, distributed Bragg reflector (DBR) lasers and distributed feedback (DFB) lasers.

One of the first structures to improve COD is the use of a transparent window area 3 as shown in FIG. 1, which shows an output end 10 of a semiconductor laser in longitudinal cross-section. Basically a quantum well active region 2 is isolated from semiconductor/facet coating 6/air interface at front facet 5. This reduces the local optical absorption and heating near the front facet 5. Also typically the transparent window area 3 blocks most of injected current 1, which is reduced to a leakage current 11 considerably smaller than the injected current 1. The transparent window area 3 can be formed using a variety of methods including, but not limited to, local etch and regrowth, ion implantation, or diffusion intermixing.

Welch et al. (U.S. Pat. No. 4,845,725) disclose a preferred structure, which employs impurity induced disordering to smear the interfaces between active region and cladding layers producing a waveguide layer with increased bandgap and thus a transparent window region at the laser facet and a graded transverse refractive index profile. Window regions having transparent waveguide layers can be produced by impurity induced disordering, i.e. the diffusion of silicon, zinc, tin or other impurity through the semiconductor layers to form the window region.

The fabrication of the structure by Welch et al. entails several diffusion or implantation steps as well as crystallographic disordering, all of which are notorious for introducing non-radiative recombination centers. Since the introduced non-radiative recombination centers extend into the active layer of the laser, which is electrically pumped, they represent a serious laser degradation and reliability risk.

There are two problems with this design. There can be leakage current through the transparent window area 3 or, even worse, along the facet 5, which has non-radiative recombination centers, even with facet coating passivation 6. Also the interface 16 between the quantum well and transparent window typically will have defects and current flowing near those defects will recombine non-radiatively.

Another structure for improving COD uses a current blocking area, or unpumped structure 4, as shown in FIG. 2, which is a longitudinal cross-sectional view of an output end 20 of a semiconductor laser. In this case one or more blocking materials or layers 4 prevent current flow near the front facet 5 and therefore reduce non-radiative recombination near the front facet 5. The current blocking area 4 can be formed using a variety of methods including, but not limited to, patterned contact metal, a blocking insulator (such as silicon nitride, silicon dioxide, aluminum oxide, titanium oxide, etc.), a current blocking implant or diffusion, or current blocking semiconductor layers (such as etching off the contact layer or doing an etch and blocking re-growth).

Yu et al. (U.S. Pat. No. 6,373,875) disclose such a semiconductor laser structure incorporating a current blocking area 4, specifically to prevent current leakage near the facet 5, as illustrated in FIG. 2.

There are two problems with this design. There will be optical absorption in the quantum well active region 2 along the section 25 where it is not pumped to transparency. Also the semiconductor/facet coating 6/air interface at the front facet 5 will typically be a location of defects causing further optical absorption.

Kamejima (U.S. Pat. No. 4,759,025) discloses a semiconductor laser structure which attempts to resolve COD problems by using an intermixing technique. The laser structure is grown with thin multiple layers located at the intended active layer. The area to be pumped electrically by an electric current is thermally interdiffused by laser irradiation to form a mixed crystal exciting region having a band gap narrower than that of the surrounding layer, which is thus transparent to emitted light. In particular the non-interdiffused area near the laser facets becomes transparent to the laser emission. Also, the pumping current flows preferentially through the lower bandgap interdiffused area, thereby reducing exposure of the laser facets to the pumping current.

Kamejima's structure is unsuitable for high power lasers for a fundamental reason, however. To achieve high output power levels and high efficiency, a single or multiple quantum well (MQW) active layer consisting of one or more very thin semiconductor layers is generally preferred. The intermixing process on which Kamejima's structure depends destroys the quantum well structure.

An object of the present invention is to improve the laser structure for use at high optical power output levels by mitigating the adverse thermal effects in the vicinity of the laser facets such as recombination diverting some of the pumping current to non-radiative recombination centers and optical absorption.

SUMMARY OF THE INVENTION

Accordingly, the present invention relates to a semiconductor laser structure pumped with an injected electrical current for high optical power output. The key features include an optically transparent section, and a current blocking section at an output facet of the diode.

The optically transparent section is protected from the injected pumping current by the overlapping current blocking section.

Another aspect of the present invention relates to an additional partially current blocking section. To further shield the output facet from the pumping current, the partially current blocking section produces a reduced profile in the injected pumping current density. Sufficient pumping current is provided however to maintain optical transparency this section.

BRIEF DESCRIPTION OF THE DRAWINGS

The invention will be described in greater detail with reference to the accompanying drawings, which represent preferred embodiments thereof, wherein:

FIG. 9 is a table comparing yield for devices with and without patterned pumping sections.

DETAILED DESCRIPTION

Figure 3:
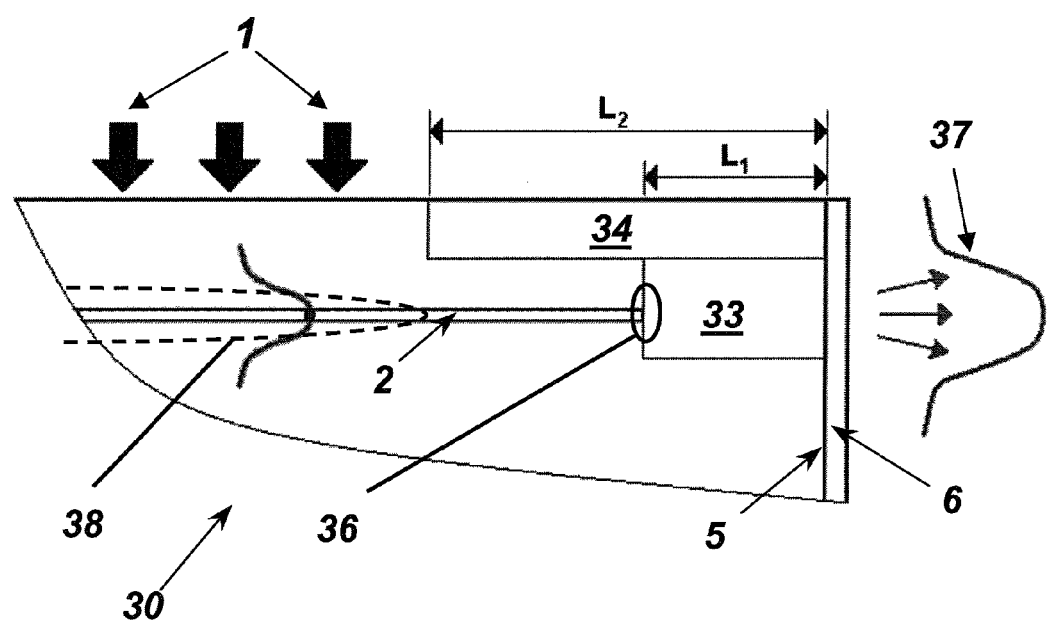
FIG. 3 shows an example longitudinal cross-section of an output window design for a semiconductor laser with combined transparent and unpumped current blocking sections according to current invention.

A first embodiment, shown in longitudinal cross-section in FIG. 3, comprises an output facet end 30 of a semiconductor laser incorporating a quantum well active region 2, a contact region for injecting pumping current 1 into a main section 38 of the quantum well active region 2, an optical reflector generally known as a laser facet 5 coated with a facet coating 6 for passivation and reflectivity control, a current blocking area 34, and a transparent window 33. The quantum well active region 2 may comprise a single quantum well, or a multiple quantum well structure. Semiconductor materials suitable for the quantum well active region 2 include, but are not limited to, AlGaAs, GaAs, GaAsP, InP, InGaAs, and InGaP. The output optical field profile is represented by curve 37. The transparent window 33 limits the optical absorption under the current blocking area 34, which substantially removes undesired electrical injection current leakage through the transparent window 33, or along the front facet 5. It also substantially removes electrical injection current near the interface 36 between the quantum well active region 2 and transparent window 33. For this reason length, $L_2$, of the current blocking area 34 would typically be longer than length, $L_1$, of the transparent window 33. However, there may be material combinations and structures, in which $L_2$ is shorter than $L_1$. Furthermore these lengths need to be optimized for best laser diode performance, high COD power limit and highest reliability under operating conditions.

Figure 4:
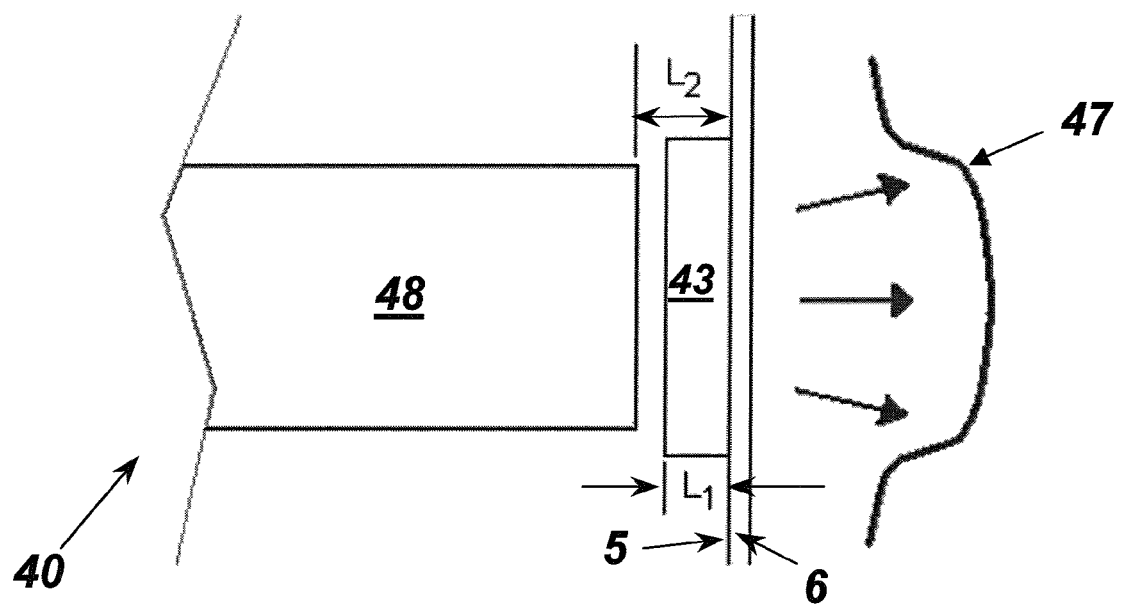
FIG. 4 shows a top view of an output end of an exemplary laser with combined transparent and unpumped current blocking window design according to current invention.

FIG. 4 is a top view of the first embodiment showing the output facet end 40 of a semiconductor laser with a current injection area 48 which extends to within a distance $L_2$ from the facet 5 coated with facet coating 6. The transparent window 43 extends from the facet 5 for a distance $L_1$. The output optical field profile is represented by curve 47.

A final problem to be addressed is excess optical loss under the current blocking area 34 that is not within the transparent window area 33 as shown in FIG. 3.

Figure 5:
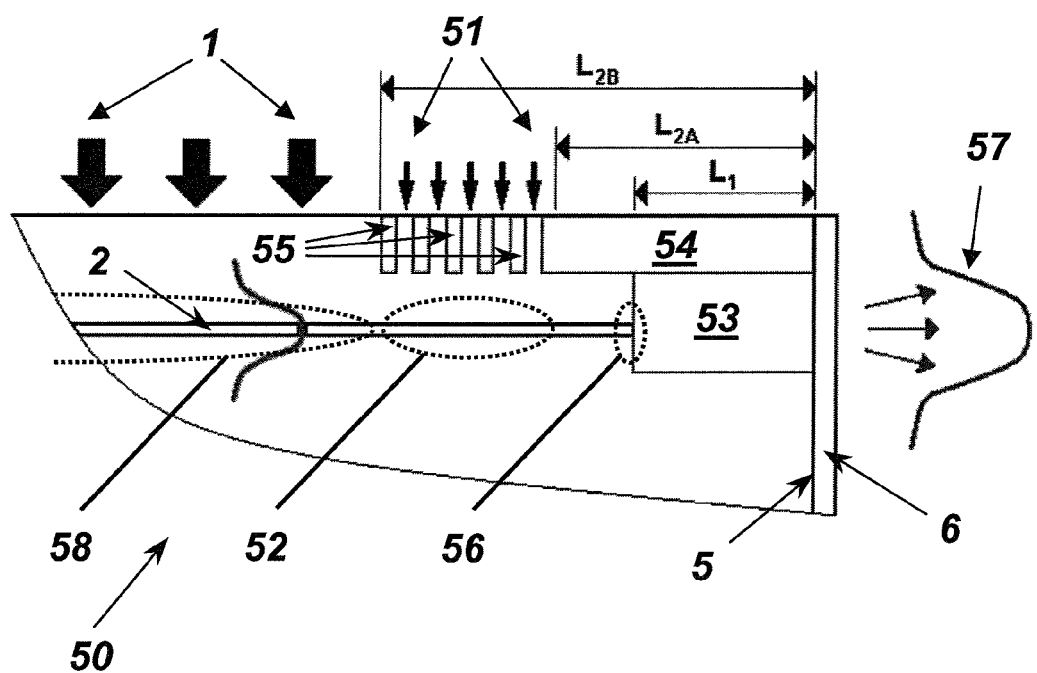
FIG. 5 is a longitudinal cross-section of an output end of an exemplary semiconductor laser with combined transparent and unpumped current blocking window design with additional partially blocked/partially pumped section.

Accordingly a second embodiment of the invention, shown in longitudinal cross-section in FIG. 5, comprises an output facet end 50 of a semiconductor laser incorporating a quantum well active region 2, a contact region 1 for injecting pumping current into a main section 58 of the quantum well active region 2, an optical reflector generally known as a laser facet 5 coated with a facet coating 6 for passivation and reflectivity control, a total current blocking section 54 of length $L_{2A}$, a partially blocking section 55 of length $L_{2B}$–$L_{2A}$ through which pumping current from a contact region 51 is injected into a partially pumped section 52 of the quantum well active region 2, and a transparent window section 53 of length $L_1$. The output optical field profile is represented by curve 57.

A section the quantum well active region, which does not receive electrical pumping will absorb lasing light emitted by a pumped section 58 of the quantum well active region 2, thus reducing lasing efficiency and causing localized heating. The transparent window section 53 is introduced to offset such potential problems by reducing optical losses by absorption and consequent heating.

The total current blocking section 54 removes undesired electrical injection current leakage through the transparent window section 53 or along the front facet 5 and removes electrical injection current near the interface 56 between the quantum well active region 2 and transparent window section 53. The partially blocking section 55 provides a means for reducing electrical current density in the partially pumped section 52 of the quantum well active region 2 produced by pumping current from the contact area 51 at an end portion(s) of the quantum well active region 2. Typically the current density in the partially pumped section 52 is a fraction of the current density resulting from injecting pumping current from the contact region 1 into the main section 58 of the quantum well active region 2.

For the reasons discussed in relation to the first embodiment, a typical design has $L_1 < L_{2A}$. For the partially blocking section 55 to have finite length for obtaining a profiled transition in current density between the total current blocking section 54 and the main section 58 pumped by pumping current from contact region 1, the lengths must also fulfill the relationship, $L_{2B}-L_{2A}>0$. Furthermore these lengths need to be optimized for best laser diode performance, high COD power limit and highest reliability under operating conditions.

Beneath the partially blocking section 55 the current density in the partially pumped section 52 will be lower than in the main lasing section 58 but just enough to reduce optical loss and improve the overall COD power limit.

As shown in FIGS. 6a-d, the contact areas 68aa, 68bb, 68cc and 68dd (corresponding to 51 in FIG. 5 and disposed generally above the partially blocking section 55) can be formed using a variety of methods including, but not limited to, patterned contact metal, multiple contacts, a patterned blocking insulator (such as silicon nitride, silicon dioxide, aluminum oxide, titanium oxide, etc.), a patterned current blocking implant or diffusion, or patterned current blocking semiconductor layers (such as etching off the contact layer or etching and blocking re-growth).

Figure 6A:
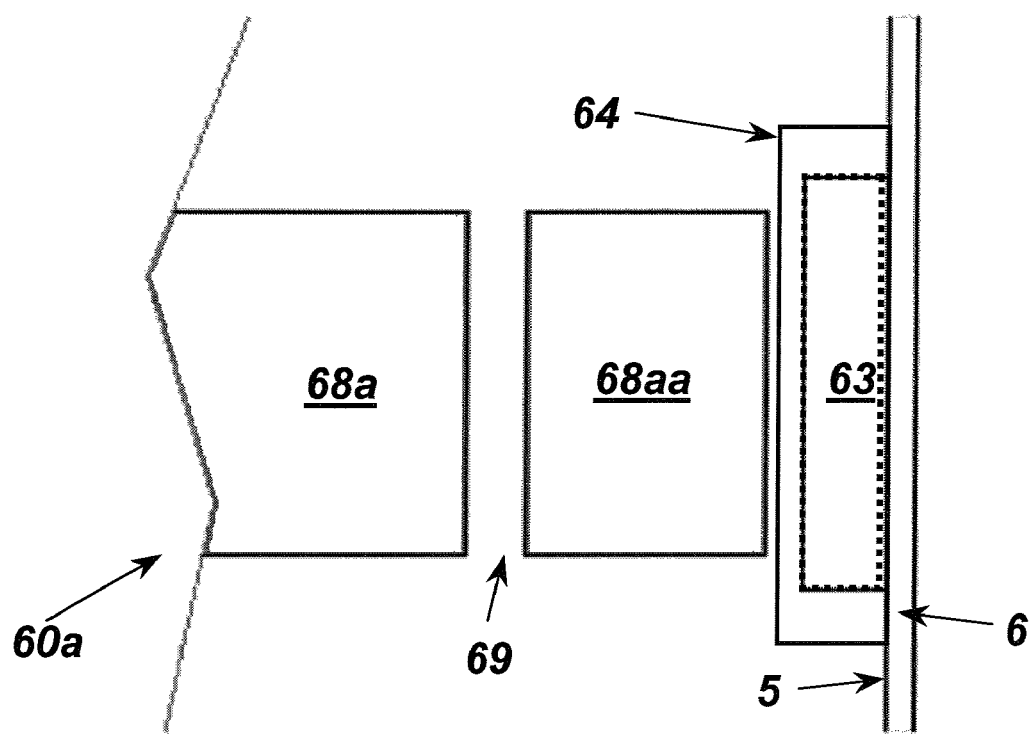
FIGS. 6a-d presents a top view of example lasers with combined transparent and unpumped current blocking window design, illustrating a variety of usable methods for adding partially blocked/partially pumped sections.

In FIG. 6a a top view of the third embodiment shows the output facet end of a semiconductor laser 60a with current injection area 68a. An extra contact 68aa adjacent to the total current blocking section 64 and separated by a gap 69 from the main contact area 68a can be used to inject a reduced current density in the quantum well active region below it.

Figure 6B:
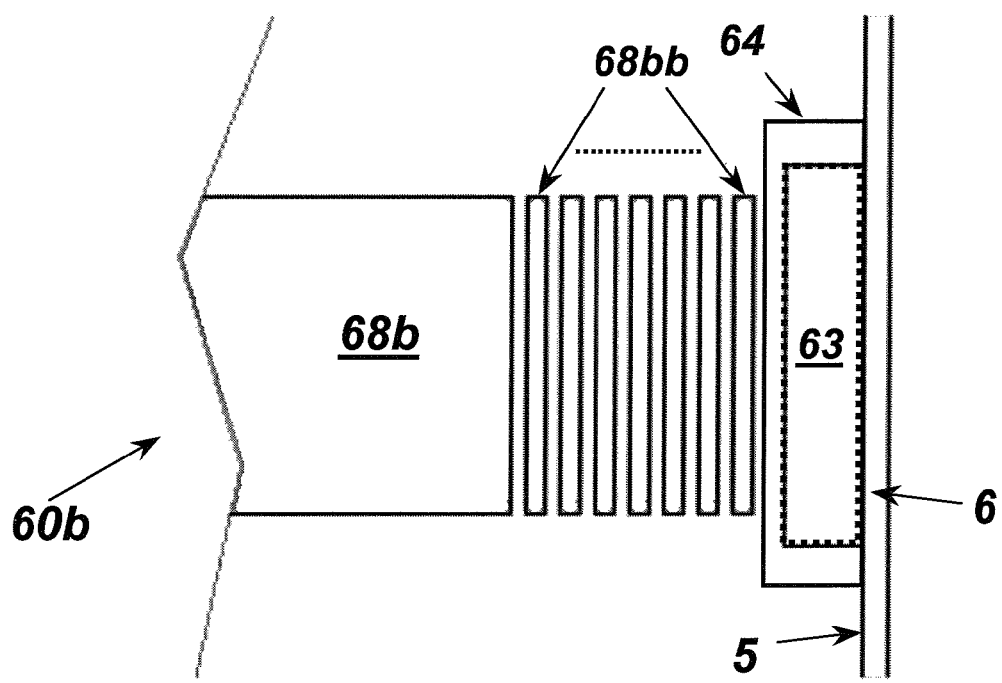

In FIG. 6b a top view of the fourth embodiment shows the output facet end of a semiconductor laser 60b with a plurality of contact stripes 68bb disposed between the total current blocking section 64 and the main contact area 68b for injecting a reduced current density in the quantum well active region below it (e.g. the partially pumped section 52 in FIG. 5).

Figure 6C:
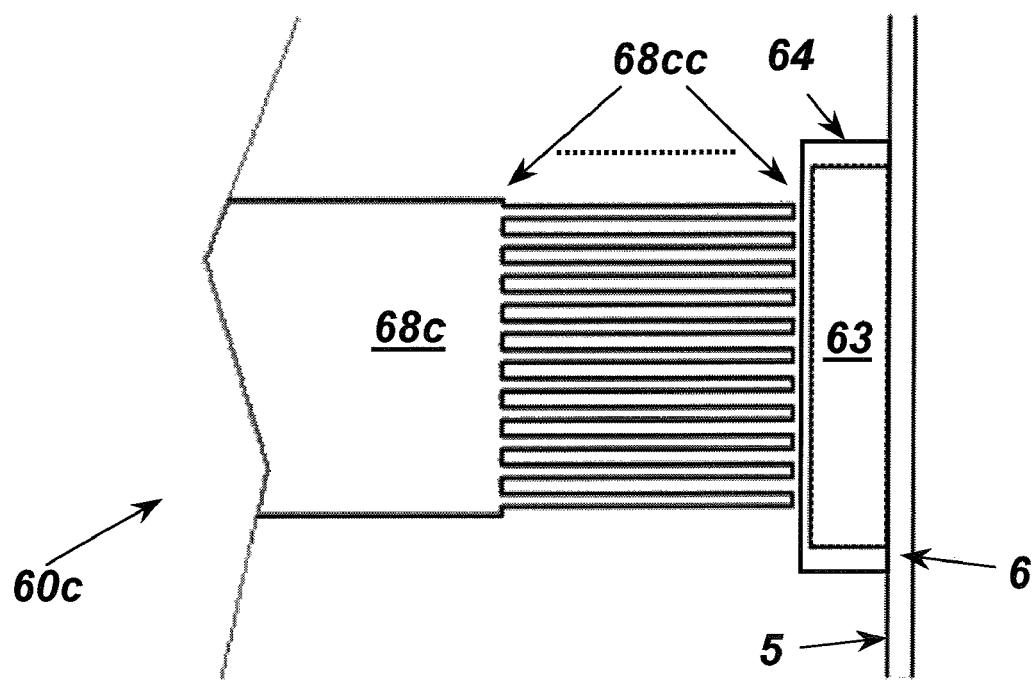

In FIG. 6c a top view of the fifth embodiment is shown comprising the output facet end of a semiconductor laser 60c with current injection area 68c comprising a plurality of contact fingers 68cc extending to the total current blocking section 64 for injecting a reduced current density in the quantum well active region below it (e.g. the partially pumped section 52 in FIG. 5).

Figure 6D:
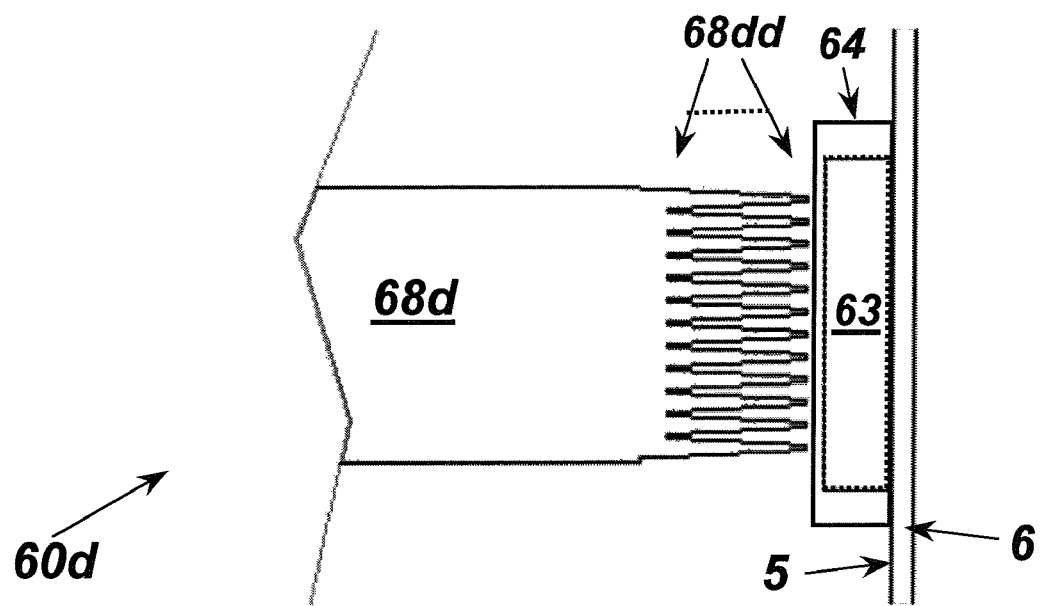

The sixth embodiment shown in FIG. 6d is similar to the fifth embodiment, the difference being in the tapering of the extended contact fingers 68dd of the current injection area 68d for controlling the spatial profile of the injected current density.

Figure 1:
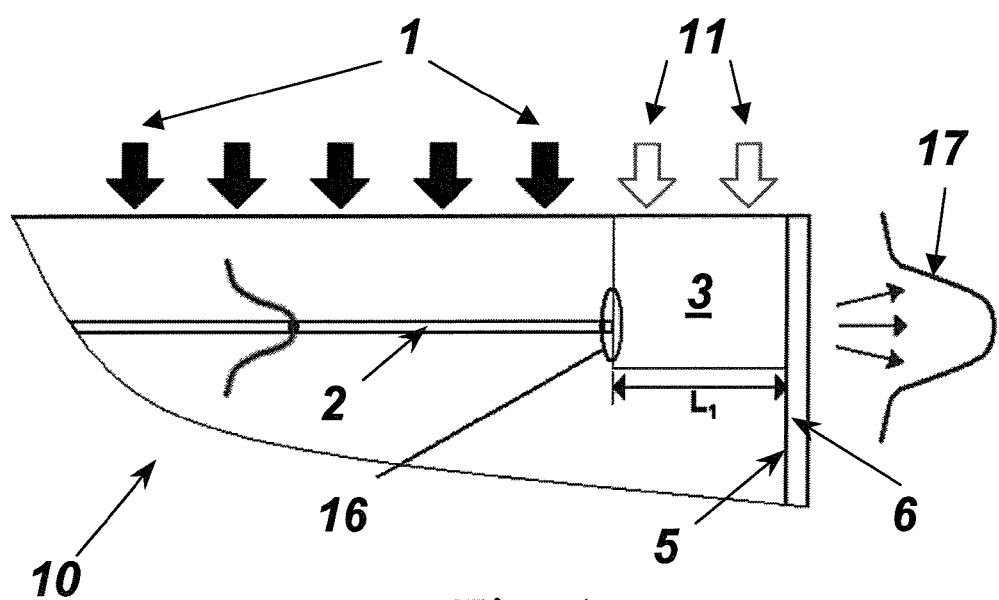
FIG. 1 (prior art) shows an example longitudinal cross-section of an output window design for a semiconductor laser with transparent section.
Figure 2:
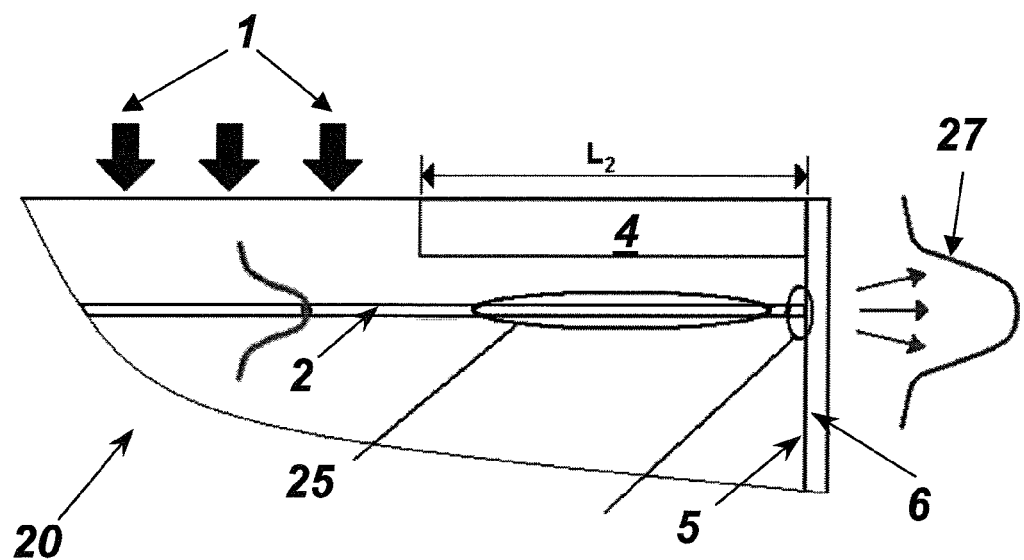
FIG. 2 (prior art) illustrates an example longitudinal cross-section of an output window design for a semiconductor laser with unpumped current blocking section.
Figure 7:
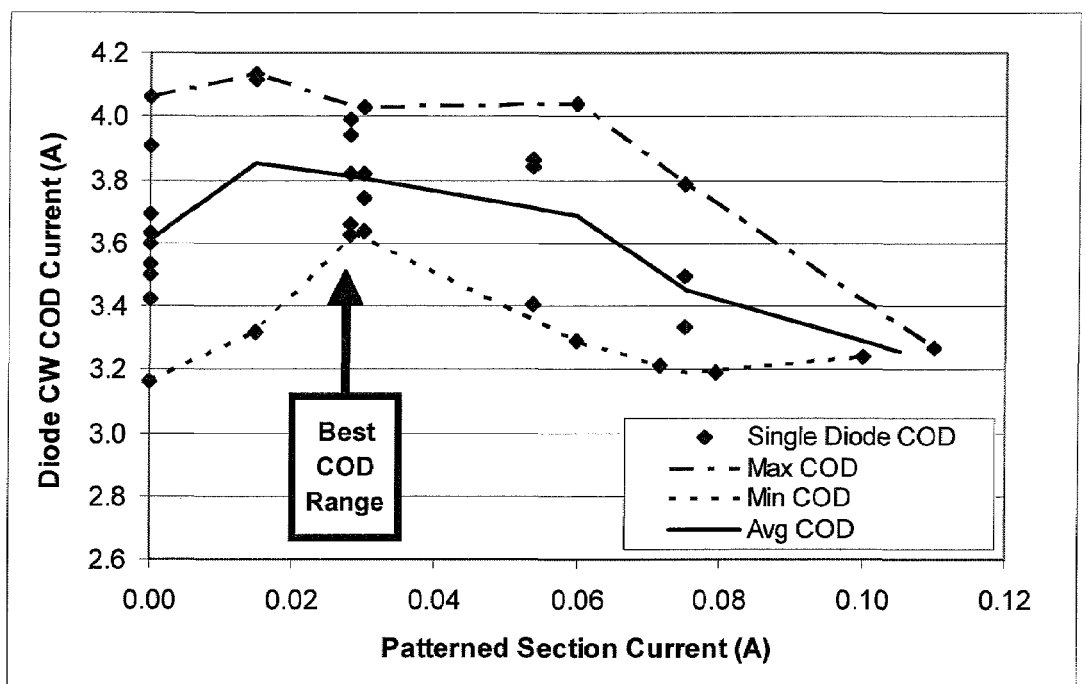
FIG. 7 is a plot of the total CW COD current level as a function of current in a short patterned contact section near the front facet.

Various experiments were performed to show that adding a partial pumping region improves the COD limit and device reliability. FIG. 7 shows results for applying various current levels to a small separate contact (such as 68aa in FIG. 6a) near the front facet 5. In the case of no current in the extra contact 68aa near the front facet 5 (corresponding to the embodiment of FIG. 3) the COD level ranges from 3.2 W to 4.0 W. In the case of uniform current injection (corresponding to the design in prior art FIG. 1 with transparent window only) the COD ranges from about 3.2 W to 3.8 W. At approximately one-half baseline current density the COD range narrows and increases to 3.6 W to 4.1 W. This indicates that a patterned pumping scheme designed to inject about one-half the current density can improve the COD.

Figure 8:
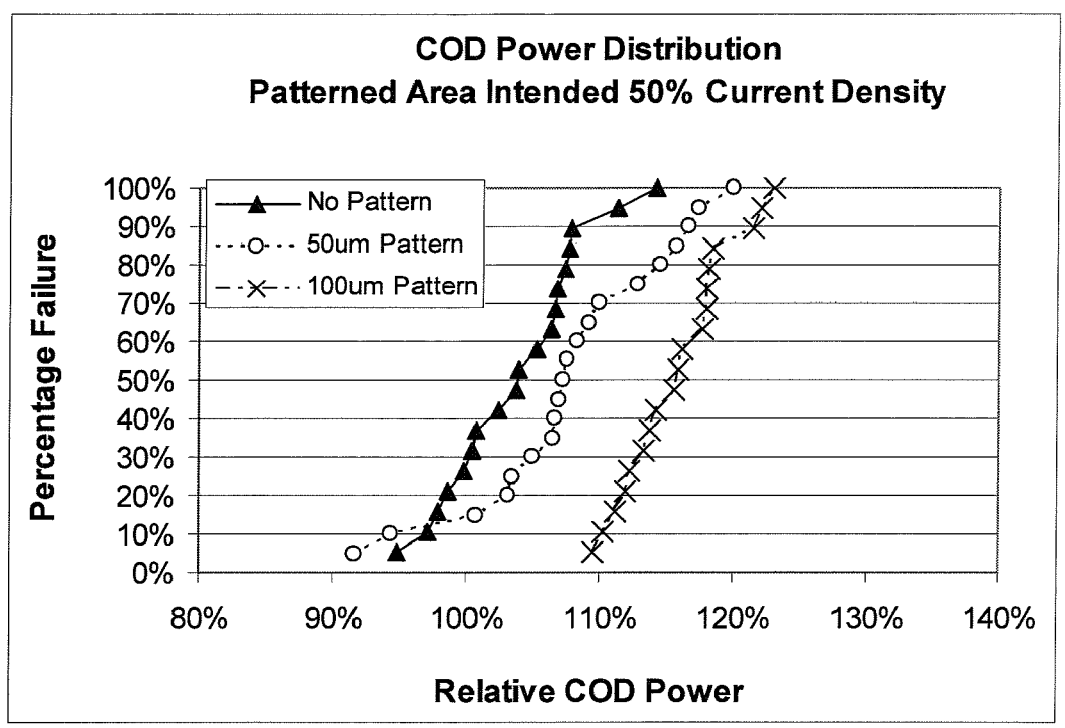
FIG. 8 is a plot of percentage failure versus COD power for devices with pumping sections patterned to give nominally 50% current density.

FIG. 8 shows the result of using a patterned partial pumping section (such as in FIG. 5 and FIG. 6) designed for injecting about one-half the current density. Going from unpumped to 50 µm partially pumped to 100 µm partially pumped improves COD level significantly. This particular set of samples illustrates the greatest improvement but in no set of samples tested case does the COD level become worse.

FIG. 9 shows the yield results of an experiment for laser diodes with a baseline combined transparent and unpumped current blocking section compared to laser diodes with an additional partially pumped/partially blocked section. The yield through a standard burn-in increases significantly from 58% to 95%, while the yield to a destructive COD test after burn-in increases even further from 78% to 100%. Again, this particular set of samples shows the most improvement but in no set of samples does the COD level become worse when using a partially pumped section.

The above experiments were conducted while injecting one half of the current density; however, alternative amounts of current injection are within the scope of this invention, e.g. preferred current density about 30% to 70%, more preferred current density about 35% to 60%, most preferred current density about 40% to 50%.

Preferred lengths for a laser cavity, $L_C$, are greater than about 0.5 mm, more preferred values range approximately from 0.5 mm to 10 mm, the most preferred range being about 0.7 mm to 5 mm.

Accordingly, the current blocking area has a preferred length $L_{2A}$ from the output facet of up to about 5% of the total laser cavity length $L_C$, more preferably between about 1 µm and 50 µm, and most preferably from about 2 µm to 30 µm.

The length $L_1$ of the transparent window area is equal to or less than the length $L_{2A}$ of the current blocking area. Preferably $L_1$ should be greater than about 0.5 µm and less than about 1% of $L_C$.

The partially pumped (or partially current blocking) section has a length $L_{2B}$ from the output facet of up to about 10% of $L_C$, more preferably between about 10 µm and about 5% of $L_C$, and most preferably between about 30 µm and about 3% of the $L_C$, wherein $L_C>L_{2B}>L_{2A}>=L_1$. The partial current blocking area extends from the current blocking area to the desired distance $L_{2B}$ from the front facet 5.

We claim:

1. A semiconductor laser having an increased catastrophic optical damage level comprising:
    a semiconductorchip having first and a second reflective surface, disposed opposite each other to form an optical cavity with a cavity length $L_c$;
    a window region of length $L_1$, extending from the second reflective surface towards the first reflective surface, for transmitting laser emission;
    an active waveguide layer within the optical cavity for emitting the laser emission to the second reflective surface through the window region, and extending from the window region towards the first reflective surface;
    a first current injection region for electrically pumping current into a main section of the active waveguide layer to produce a first current density for obtaining the laser emission;
    a first blocking layer of length $L_{2A}$ extending from the second reflective surface towards the first reflective surface for blocking a flow of the current through the window region and through a blocked region of the semiconductor chip, wherein $L_{2A}$ is greater than or equal to the length of the window region, $L_1$; and
    a second current injection region for electrically pumping current into a partially pumped section of the active waveguide layer disposed between the first blocking layer and the first current injection region to produce a second current density, wherein the second current density is less than the first current density.

2. The semiconductor laser of claim 1 wherein the cavity length, $L_c$, is greater than about 0.5 mm.

3. The semiconductor laser of claim 1 wherein the cavity length, $L_c$, is greater than about 0.7 mm and less than about 5 mm.

4. The semiconductor laser of claim 1 wherein the first blocking layer length, $L_{2A}$, is less than about 5% of the cavity length, $L_c$.

5. The semiconductor laser of claim 1 wherein the first blocking layer length, $L_{2A}$, is greater than about 2 μm and less than about 30 μm.

6. The semiconductor laser of claim 1 wherein the window region length, $L_1$, is greater than about 0.5 μm and less than about 1% of the cavity length, $L_c$.

7. The semiconductor laser of claim 1 wherein the active waveguide layer comprises one or more of AlGaAs, GaAs, GaAsP, InP, InGaAs, and InGaP.

8. The semiconductor laser of claim 1 wherein the second current density is greater than about 30% and less than about 70% of the first current density.

9. The semiconductor laser of claim 1 wherein the second current density is greater than about 40% and less than about 50% of the first current density.

10. The semiconductor laser of claim 1 wherein the first current injection region comprises a main contact area having a main contact width.

11. The semiconductor laser of claim 10 wherein the second current injection region comprises an oblong contact area equal in width to the main contact width, disposed between the main contact area and the first blocking layer.

12. The semiconductor laser of claim 10 wherein the second current injection region comprises a plurality of separate contact stripes oriented parallel to the second reflective surface, having a length equal to the main contact width and disposed between the main contact area and the first blocking layer.

13. The semiconductor laser of claim 10 wherein the second current injection region comprises a plurality of contact fingers extending from the main contact area to the first blocking layer.

14. The semiconductor laser of claim 13 wherein the contact fingers have tapered ends.

15. A semiconductor laser having an increased catastrophic optical damage level comprising:
a semiconductor chip having first and a second reflective surfaces, disposed opposite each other to form an optical cavity with a cavity length $L_c$;
an window region of length $L_1$, extending from the second reflective surface towards the first reflective surface, for transmitting laser emission;
an active waveguide layer within the optical cavity for emitting the laser emission to the second reflective surface through the window region, and extending from the window region towards the first reflective surface;
a first current injection region along a longitudinal axis of the optical cavity for electrically pumping current into a main section of the active waveguide layer to produce a first current density for obtaining the laser emission; and
a first blocking layer of length $L_{2A}$ for blocking a flow of the current through the window region and through a blocked region of the semiconductor chip and extending from the second reflective surface towards the first reflective surface, wherein $L_{2a}$ is greater than or equal to the length of the window region, $L_1$; and
a second blocking layer disposed between the first blocking layer and the main section of the active waveguide layer for partially blocking the current from flowing through a partially blocked portion of the active waveguide layer whereby a current density in the partially blocked portion of the active waveguide layer is lower than a current density in the main section of the active waveguide layer in which the second blocking layer does not hinder current flow.

16. The semiconductor laser of claim 15 further comprising a second current injection region for electrically pumping current into the partially blocked portion of the active waveguide layer.

* * * * *